(12) United States Patent
Meinhart

(10) Patent No.: US 12,171,084 B1
(45) Date of Patent: Dec. 17, 2024

(54) METHOD OF SUBSIDIZING COST OF PROVIDING INFORMATION

(71) Applicant: MARA Holdings, Inc., Las Vegas, NV (US)

(72) Inventor: Carl D. Meinhart, Santa Barbara, CA (US)

(73) Assignee: MARA Holdings, Inc., Las Vegas, NV (US)

( * ) Notice: Subject to any disclaimer, the term of this patent is extended or adjusted under 35 U.S.C. 154(b) by 0 days.

(21) Appl. No.: 18/628,636

(22) Filed: Apr. 5, 2024

(51) Int. Cl.
*H05K 7/20* (2006.01)
*G06Q 30/0283* (2023.01)

(52) U.S. Cl.
CPC ......... *H05K 7/203* (2013.01); *G06Q 30/0283* (2013.01)

(58) Field of Classification Search
CPC .............. H05K 7/203; H05K 7/20818; H05K 7/20327; H05K 7/2039; G06Q 30/0283; G06F 1/20
See application file for complete search history.

(56) References Cited

U.S. PATENT DOCUMENTS

| | | | | |
|---|---|---|---|---|
| 4,211,207 A * | 7/1980 | Molivadas | ............ | F24S 10/503 165/300 |
| 11,761,689 B1 * | 9/2023 | Stolyarov | ............ | F25B 15/002 62/79 |
| 2012/0048716 A1 * | 3/2012 | Sonnek | ............ | B01D 5/006 203/19 |
| 2014/0218859 A1 * | 8/2014 | Shelnutt | ............ | H05K 7/20809 361/679.46 |
| 2015/0060009 A1 * | 3/2015 | Shelnutt | ............ | H05K 7/20809 165/11.1 |
| 2015/0233619 A1 * | 8/2015 | Shedd | ............ | F25B 41/20 62/62 |
| 2022/0087049 A1 * | 3/2022 | Smith | ............ | H05K 7/20818 |
| 2022/0369493 A1 * | 11/2022 | Alissa | ............ | H05K 7/203 |
| 2022/0394880 A1 * | 12/2022 | van Wijk | ............ | G05D 23/1931 |

OTHER PUBLICATIONS

DE 102021114326, Bederna et al; publication year: Dec. 8, 2022.*

* cited by examiner

*Primary Examiner* — Frantz F Jules
*Assistant Examiner* — Martha Tadesse
(74) *Attorney, Agent, or Firm* — Fish IP Law, LLP

(57) ABSTRACT

Thermal energy from a two-phase immersion-cooling system containing a computer system is operably coupled with a vapor-phase compressor, heat exchanger, pressure regulator, and controller, to provide thermal energy at an elevated temperature to drive a commercial process. The immersion-cooling system can advantageously be used to cool computer systems, Bitcoin miners, crypto miners or other thermal energy producing devices. The system operates by extracting vapor of the working fluid from the headspace of the immersion-cooling system, increasing the pressure and temperature of the extracted vapor by substantially isentropic compression, and then passing the high-pressure and high-temperature vapor to a heat exchanger, thereby providing thermal energy to the commercial process through heat transfer. Vapor from the heat exchanger is then cooled to a liquid phase, reduced in pressure, and returned to the tank of the immersion-cooling system.

27 Claims, 7 Drawing Sheets

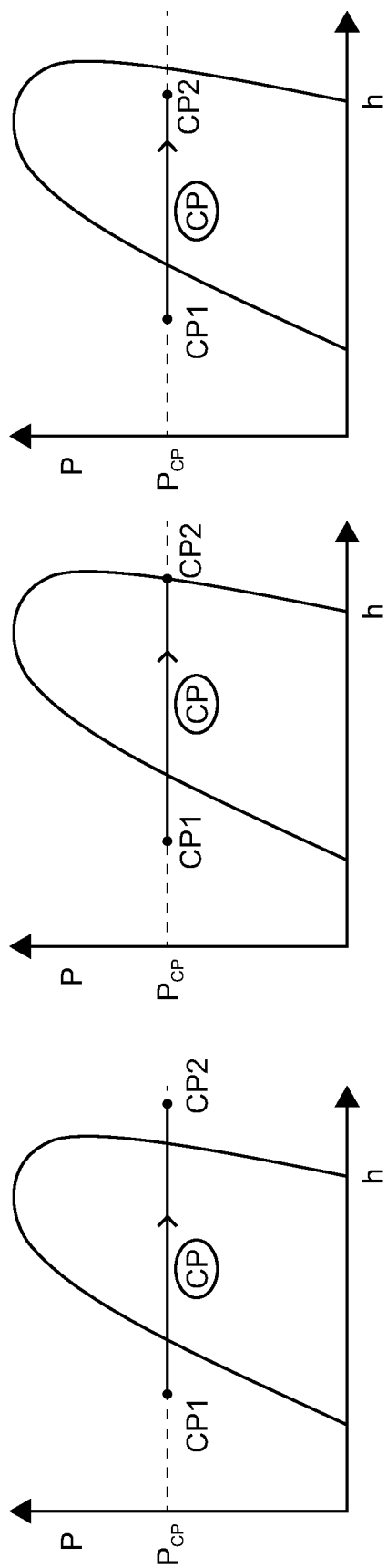
FIG. 6A
FIG. 6B
FIG. 6C
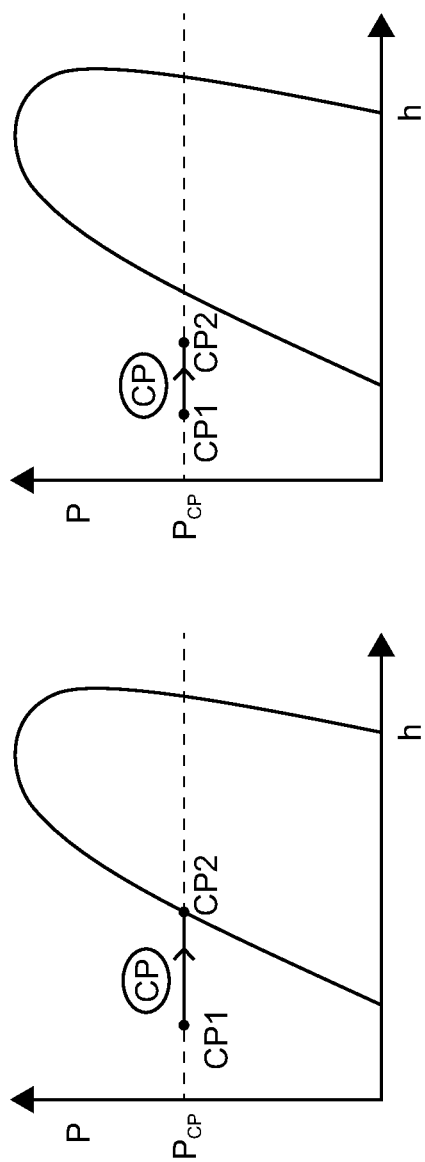
FIG. 6D
FIG. 6E

METHOD OF SUBSIDIZING COST OF PROVIDING INFORMATION

FIELD OF THE INVENTION

The field of invention is high-performance computer systems, including for example Bitcoin mining.

BACKGROUND

The following description includes information that can be useful in understanding the present invention. It is not an admission that any of the information provided herein is prior art or relevant to the presently claimed invention, or that any publication specifically or implicitly referenced is prior art.

Prior art two-phase immersion-cooling computer systems require CPUs/Miners to be immersed in a dielectric working fluid. The dielectric fluid undergoes a phase change from a saturated liquid to a saturated vapor. The saturated vapor is condensed back into the liquid by removing thermal energy, such that the liquid can be reused in the cooling process. However, this process of removing thermal energy requires additional energy to drive pumps and/or cooling fans. In addition, rejecting this thermal energy to the surrounding environment can require that the surrounding environment be at a lower temperature than the dielectric working fluid.

The standard practice in the high-performance computing industry is to reject the thermal energy from the working fluid by extracting thermal energy (i.e. internal energy or enthalpy). In contrast to standard practice in the high-performance computing industry, in the inventive subject matter, energy is added to the working fluid vapor by compressing the vapor, before the thermal energy is extracted.

Thermal energy generated from computer systems can be at a relatively low temperature of 40° C. to 80° C., which means that according to the second law of thermodynamics, removing the generated thermal energy is not very efficient for producing useful mechanical work. For example, assuming a waste thermal energy temperature of $T_h$=60° C. (333K), and a heat sink ambient temperature of $T_c$=20° C. (293K), a Carnot heat engine (ideal heat engine) has a maximum theoretical efficiency of $\eta_{HE}$=1-$T_c$/$T_h$=1-293/333=0.12 (as discussed by Cengel, Y. A., Boles, M. A. Thermodynamics: An Engineering Approach, $8^{th}$ Ed. McGraw Hill, incorporated herein by reference). This means that a heat engine could at best convert 12% of the waste thermal energy into mechanical work and the remaining 88% would need to be rejected by a different mechanism such as heat transfer. This low efficiency renders impractical the use of a heat engine to extract enthalpy from the resulting thermal energy for mechanical work.

In the of field high-performance computing, such as Artificial Intelligence computing, crypto mining, Bitcoin mining, or other computing environments, computer systems take in electrical energy and information, perform computations using that information, and then output information relating to those computations. This process converts the electrical energy into thermal energy. This thermal energy must then be rejected to the surrounding environment.

High-performance computing can utilize large immersion-cooling systems to remove the resulting thermal energy from the CPUs. The resulting thermal energy may be at too low of a temperature to be efficiently repurposed for other commercial processes, including for example generating mechanical work through a turbine, distilling industrial chemicals, distilling petroleum chemicals, boiling water, distilling water, distilling alcohol, desalination of water, and other commercial processes.

The inability to repurpose the resulting thermal energy in an efficient manner to drive additional commercial processes is a longstanding problem in the high-performance computing industry. This problem is particularly important for Bitcoin mining, which utilizes very significant amounts of electrical energy. Most of the resulting thermal energy is rejected to the surrounding environment, and currently there are few practical ways to utilize the rejected thermal energy to offset the energy cost.

SUMMARY OF THE INVENTION

The inventive subject matter provides apparatus, systems, and methods in which costs of using computer systems to provide information can be subsidized by repurposing otherwise wasted thermal energy to drive at least one commercial process.

By using the otherwise wasted thermal energy for additional commercial processes, the commercial process can provide revenue to help offset the total energy cost of the information process. This is particularly important in the Bitcoin mining industry where profit margins are being reduced because the profit incentives of Bitcoin mining are being reduced, and global competition is increasing.

In general, the thermodynamic system operates by extracting vapor from the headspace of an immersion-cooling tank. The thermal energy from this vapor can be more efficiently utilized by first increasing the temperature and pressure by vapor-phase compression of the working fluid to a higher temperature and pressure. The higher temperature of the working fluid can then be used to transfer thermal energy using heat transfer through a heat exchanger, to drive a commercial process. The commercial process can be any thermodynamic process that can benefit from heat transfer.

The systems and methods contemplated herein can use any suitable working fluid in the immersion-cooling process, including commercially-available fluids having a boiling temperature of 40° C. to 80° C., inclusive. Exemplary working fluids include 3M FC 72 (B.P. 56° C.), 3M FC 3284 (B.P. 49° C.), Solvay Galden HT™ 55 (B.P. 55° C.), 3M Novec 7000™ (B.P. 34° C.), 3M Novec 7100™ (B.P. 61° C.), 3M Novec 7200™ (B.P. 76° C.), Novec 649™ (B.P. 49° C.), chemistries such as PFCs, HFEs, FKs, HFOs, and mixtures thereof.

The compression step of the thermodynamic system can advantageously raise the temperature of the working fluid by an amount that is appropriate for a co-located commercial process. In different embodiments, for example, this can be an increase of 75-100° C., 25-75° C., 35-55° C., or even 1-25° C. From another perspective the compression step of the thermodynamic system can advantageously raise the temperature of the working fluid to at least 80-110° C., 110° C.-125° C., or even 125° C.-160° C. If the co-located commercial process comprises boiling water, for example, the thermal energy input could have a temperature of approximately 112° C., and if the working fluid in the immersion-cooling process has a boiling point of 76° C., the compression step could be configured to raise the temperature of the working fluid by approximately 36° C.

Removing thermal energy from the thermodynamic system can be accomplished in any suitable manner, including, for example, using a heat exchanger, a condenser, or the like.

Contemplated commercial applications include, but not limited to, generating mechanical work through a turbine, distilling industrial chemicals, distilling petroleum chemicals, boiling water, distilling water, distilling ethyl or other alcohols, desalination of water, and other commercial processes.

In order to more easily describe the relevant thermodynamic processes mathematically, thermodynamic processes are often idealized as being quasi-steady and in quasi-equilibrium. In addition, processes can be idealized as occurring with some constant property, such as constant temperature (isothermal), constant pressure (isobaric), constant volume (isochoric), constant enthalpy (isenthalpic), constant entropy (isentropic), and has no heat transfer (adiabatic). These idealizations provide a convenient framework for describing and analyzing these processes. A POSITA would appreciate that in practice these idealized thermodynamic processes can be used to approximate actual thermodynamic processes, but that they are only an approximation, and that actual thermodynamic processes will deviate from the idealization.

One example is fluid flowing through a pipe, tube, or heat exchanger can have a pressure drop resulting from viscous losses of the fluid. This pressure drop can be finite, but relatively small compared to relevant thermodynamic pressure scales. Therefore, this pressure drop can be important from a fluid mechanics viewpoint to drive the flow, but might not be important from a thermodynamic viewpoint, because a small but finite pressure drop (substantially isobaric) doesn't significantly affect the thermodynamic process or resulting thermodynamic state.

In another example of nucleic boiling, the bubbles create fluctuations in the local pressure field. However, from a thermodynamic viewpoint, the process is again substantially isobaric.

As used herein, the term "substantially" with respect to isobaric, isenthalpic, and isentropic processes means the actual process used results in a thermodynamic state with property values that are within 25% of the property values what would result from the associated ideal process. For example, if the process is substantially isobaric, then the absolute pressure resulting from the process is within 25% of the absolute pressure before the process occurs. Similarly, if the process is substantially isenthalpic, then the enthalpy resulting from the process is within 25% of the enthalpy before the process occurs. Similarly, if the process is substantially isentropic, then the entropy resulting from the process is within 25% of the entropy before the process occurs. For the purposes herein, enthalpy and entropy values can be relative to a reference state at an absolute pressure of 0.1 atm and the freezing temperature of the liquid phase (freezing point measured at 1 atm of absolute pressure). A POSA will appreciate that if the thermodynamic properties relative to this reference state are not supplied by the manufacturer, then a POSA could assume constant values of specific heat to estimate properties of the compressed liquid relative to the reference state.

In another example, the thermodynamic process of compressing a vapor can be idealized as an isentropic process, which can occur if the process is adiabatic and internally reversible. However, in practice there can be some type of irreversibility that generates entropy. Furthermore, there can be heat transfer to or from surroundings that can transfer entropy to or from the working fluid.

In another example, an isenthalpic thermodynamic process can be an idealization of flow through a device that is well insulated, does not significantly exchange heat with the surrounding environment (adiabatic), and where the main form of exchanging energy can be limited to flow in or out of the device. Examples of idealized isenthalpic flow can include flow through well-insulated pipes, tubes, valves, pressure regulators, expansion valves, diffusers, nozzles, and the like (as discussed by Cengel, Y. A., Boles, M. A. Thermodynamics: An Engineering Approach, 8th Ed. McGraw Hill, incorporated herein by reference).

The recitation of ranges of values herein is merely intended to serve as a shorthand method of referring individually to each separate value falling within the range. Unless otherwise indicated herein, each individual value is incorporated into the specification as if it were individually recited herein, and ranges include their endpoints.

Various objects, features, aspects, and advantages of the inventive subject matter will become more apparent from the following detailed description of preferred embodiments, along with the accompanying drawing figures in which like numerals represent like components.

BRIEF DESCRIPTION OF THE DRAWINGS

FIGS. 6A, 6B, 6C, 6D, and 6E are exemplary thermodynamic process (pressure-enthalpy) diagrams for commercial processes that could be driven by the inventive subject matter.

DETAILED DESCRIPTION

The following discussion provides many example embodiments of the inventive subject matter. Although each embodiment represents a single combination of inventive elements, the inventive subject matter is considered to include all possible combinations of the disclosed elements. Thus, if one embodiment comprises elements A, B, and C, and a second embodiment comprises elements B and D, then the inventive subject matter is also considered to include other remaining combinations of A, B, C, or D, even if not explicitly disclosed.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

Figure 1:
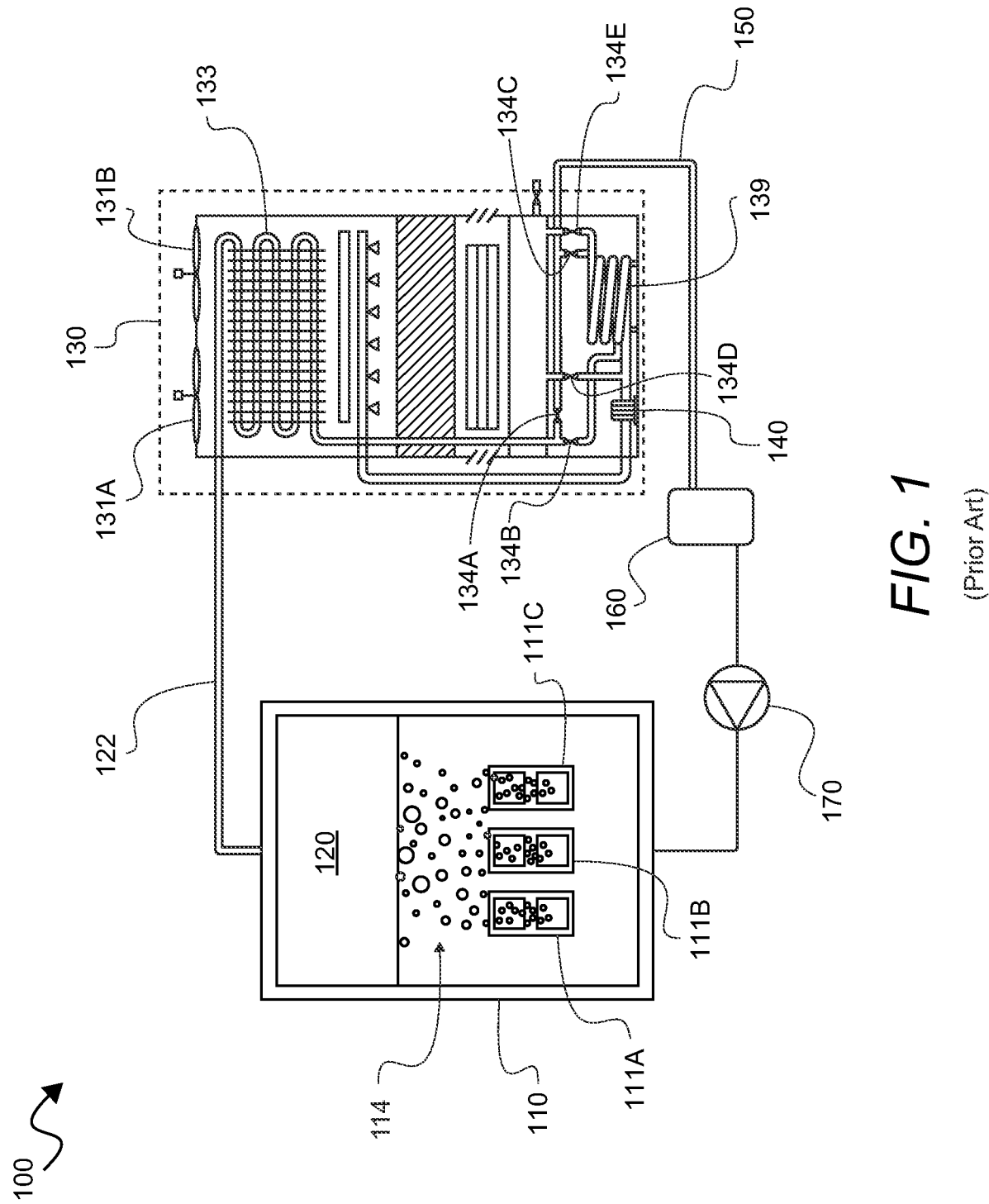
FIG. 1 is a flow diagram of a prior art two-phase immersion-cooling system.

In FIG. 1, a prior art two-phase immersion-cooling system 100 is used to provide cooling to crypto mining computer systems. System 100 generally includes a tank 110 that contains a working fluid 114 in which CPUs/Miners 111A, 111B, and 111C are immersed, and a headspace 120 that contains a vapor-phase of the working fluid 114. Vapor from the headspace 120 is passed to a cooling system 130 via fluid connector 122. The cooling system 130 condenses the vapor back to a liquid phase, which is then returned to the tank 110.

The working fluid 114 can comprise any suitable composition that is sufficiently non-toxic, non-corrosive, and has a relatively low saturation temperature at atmospheric temperature (referred to here as the boiling point). In most commercially-available working fluids in computer immersion-cooling systems have a boiling point (at 1 atm) of 40° C. to 80° C. Exemplary fluids include 3M FC 72 (B.P. 56° C.), 3M FC 3284 (B.P. 49° C.), Solvay Galden HT™ 55 (B.P. 55° C.), 3M Novec 7000™ (B.P. 34° C.), 3M Novec 7100™ (B.P. 61° C.), 3M Novec 7200™ (B.P. 76° C.), Novec 649™ (B.P. 49° C.), and chemistries such as PFCs, HFEs, FKs, HFOs, etc). Exemplary fluids can include suitable mixtures of two or more fluids, wherein each of the two or more fluids can have different boiling points. For the purpose here, boiling point (B.P.) refers to the saturation temperature of the working fluid at 1 atm of absolute pressure. The saturation temperature is a function of the absolute pressure.

The cooling system 130 can be any system suited to extract thermal energy by condensing the vapor-phase of the working fluid 114 to its liquid phase. In this particular prior art embodiment, cooling system 130 generally includes fans 131A and 131B, air cooled heat exchanger 133, JT valves 134A, 134B, 134C, 134D and 134E, water-cooled heat exchanger 139 and a water pump 140. Liquid working fluid 114 passes from the cooling system 130 via fluid connector 150 to a reservoir 160, and then pumped by pump 170 to tank 110.

In the prior art system of FIG. 1, 100% of the thermal energy removed from the CPUs/Miners 111A, 111B and 111C can be rejected to the surrounding environment and subsequently wasted. Furthermore, there is an energy cost associated with removing the wasted thermal energy, wherein energy is required to drive pumps 170, fans 131A 131B.

For the discussion herein, the inventive subject matter disclosed in FIGS. 2-6, show thermodynamic states that are depicted by the numbers 1-6, CP1 and CP2, and thermodynamic processes that are denoted by letters A-D, and CP.

Figure 2A:
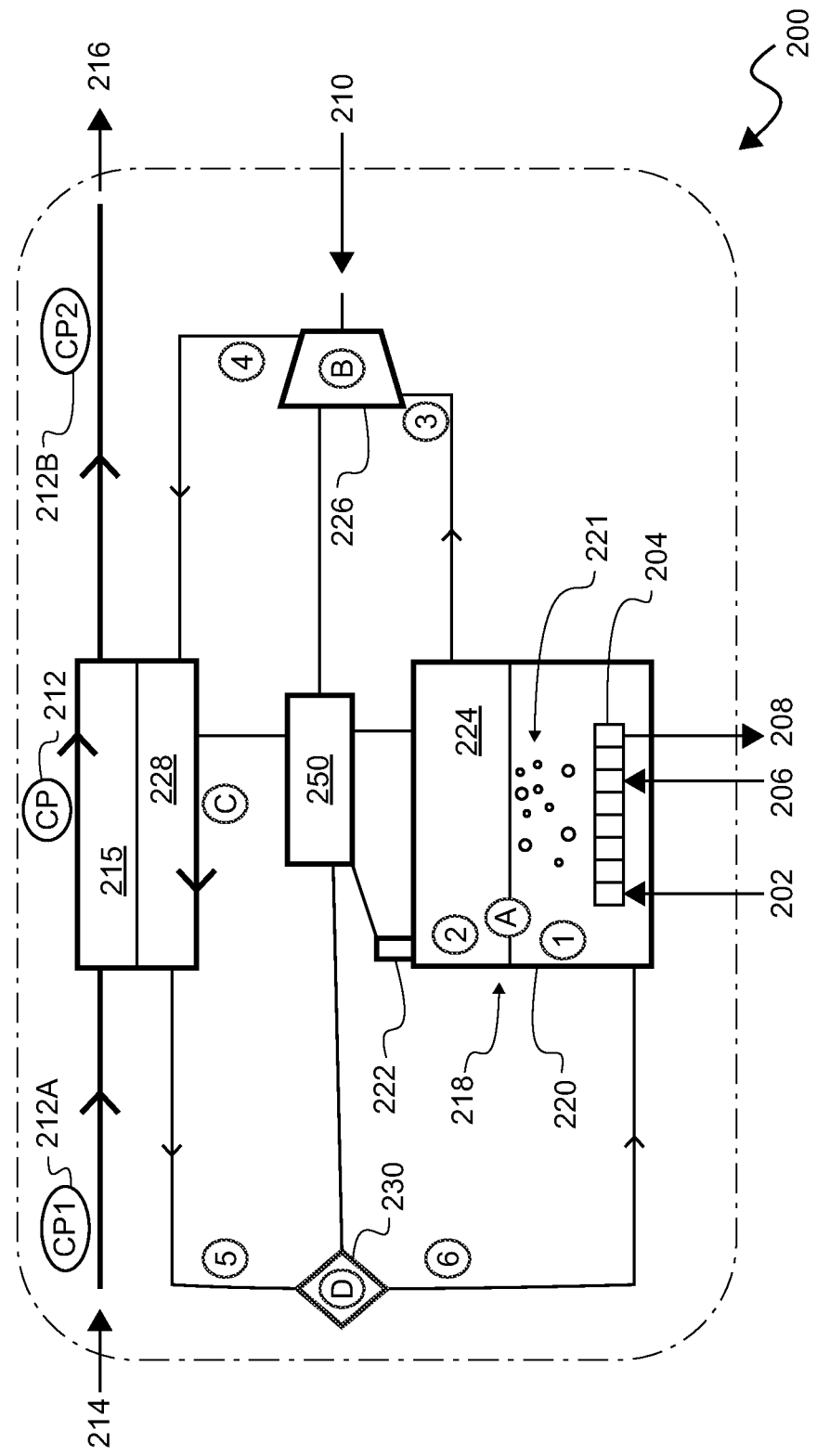
FIGS. 2A and 2B are flow diagrams of systems that subsidize cost of producing information by efficiently using otherwise wasted thermal energy.

FIG. 2A shows an embodiment of the inventive subject matter. System 200 produces information 208 and drives commercial process 212. System 200 receives electrical work 202, information 206, electrical work 210, and produces information 208 resulting from computations by computer system 204. Simultaneously, the thermal energy resulting from the computational process is used to drive commercial process 212. The production of commercial process 212 can help offset the input energy cost associated with electrical work 202, and electrical work 210.

Computer system 204 is contained within immersion-cooling system 218, which contains a suitable working fluid. The working fluid is in a saturated low-pressure liquid-phase at thermodynamic State 1. Electrical energy (electrical work 202) is supplied to computer system 204 to drive computational process 212 wherein the electrical energy (electrical work 202) is converted to thermal energy. This thermal energy from computer system 204 is transferred to the low-pressure liquid-phase working fluid 221 through nucleic boiling (thermodynamic Process A), creating bubbles of low-pressure vapor-phase (State 2) working fluid 221. These vapor bubbles rise due to buoyancy into headspace 224.

As used herein, the term "low-pressure" with respect to vapor-phase and liquid-phase means a pressure within 1 atmosphere±0.5 atmospheres of absolute pressure.

As used herein, the term "high-pressure" with respect to vapor-phase and liquid-phase means an absolute pressure that is at least 5% greater the absolute pressure of the "low-pressure" state, and less than 100 atmospheres of absolute pressure. Unless otherwise noted, the term "pressure" means absolute pressure.

Immersion-cooling system 218 can comprise a suitable working fluid 221, tank 220, computer system 204, headspace 224, and bellows 222. Bellows 222 can be incorporated into immersion-cooling system 218 to provide volumetric expansion of the tank 220 to help regulate a nearly constant tank pressure. The degree of bellows 222 expansion can be monitored.

Low-pressure vapor-phase working fluid 221 at thermodynamic (State 2) is directed from headspace 224, through a fluid connector to compressor 226 at State 3. Compressor 226 can compress (thermodynamic process B) the low-pressure vapor-phase working fluid (State 3) to a high-pressure vapor-phase (State 4) of the working fluid 221. Compressor 226 takes in energy in the form of electrical work 210 to drive the compression process (B).

For the inventive subject matter, vapor-phases at State 2, State 3, and State 4 can comprise a saturated liquid-vapor mixture having a quality x≥0.5, a saturated vapor, or a superheated vapor. For the inventive subject matter, liquid-phases at State 1, State 5, and State 6 can comprise a compressed liquid, a saturated liquid, or a saturated liquid-vapor mixture having a quality x<0.5.

Compressor 226 can be any suitable compressor that is able to produce the desired pressures for State 3 and State 4, and the desired mass flow rates. Compressor 226 is materially compatible with working fluid 221. Exemplary compressors include scroll-type compressors and reciprocal-type compressors.

It is important to note that before any resulting thermal energy from the computer system 204 is conveyed to the commercial process 212, additional energy is added to the working fluid 221 through a compression process (Process B). Compression increases both the pressure and temperature of working fluid 221.

The high-pressure vapor-phase State 4 working fluid 221 is directed to heat exchanger 228. Heat exchanger 228 is preferably a counter-flow heat exchanger. Heat exchanger 228 transfers thermal energy from the high-pressure vapor-phase State 4 to a commercial process fluid 215 to drive commercial process 212. In the heat exchanger 228 the working fluid 221 preferably undergoes substantially isobaric condensation (denoted as Process C), thereby condensing the high-pressure vapor-phase (State 4) working fluid 221 to high-pressure liquid-phase (State 5) working fluid 221. Optionally, Process C can include sensible cooling of working fluid 221.

Simultaneously, commercial process 212 extracts commercial process fluid 215 from commercial process fluid source 214, and directs the commercial process fluid 215 through heat exchanger 228, and towards commercial process fluid sink 216. The commercial process fluid 215 can be driven by gravity, pump, or any other suitable means. In preferred embodiments, commercial process fluid 215 can comprise water, petroleum chemicals, alcohol, and/or other suitable commercial fluids.

The commercial process 212 can be characterized by the commercial process fluid 215 having a relatively low enthalpy (State CP1) 212A entering heat exchanger 228. The commercial process fluid 215 can then flow through heat exchanger 228, absorbing thermal energy from the high-pressure working fluid 221 through heat transfer, and exiting heat exchanger 228 at a relatively high enthalpy (State CP2) 212B, and being directed towards commercial process fluid sink 216.

Because the thermal energy in heat exchanger 228 is conveyed by heat transfer, the temperature of the incoming high-pressure vapor-phase (State 4) has a temperature that is higher than that of the desired operating temperature of commercial process 212. One primary advantage of compressing the vapor (Process B) is that it increases the temperature of the vapor from State 3 to State 4. Compressing the vapor can be advantageous over simply applying heat to the vapor to increase its temperature, because applying heat can substantially increase the entropy of the vapor, which could be disadvantageous.

Heat exchanger 228 extracts thermal energy from the high-pressure vapor (State 4) working fluid 221 to either partially condensed or fully condensed high-pressure liquid (State 5) working fluid 221. State 5 can comprise a saturated liquid-vapor mixture (quality, $x_5$<0.5), a saturated liquid, or a compressed liquid. State 5 can depend in-part on how much thermal energy is extracted by heat exchanger 228, as well as the pressure of the working fluid 221 exiting heat exchanger 228.

In some embodiments, the temperature at State 5 can be the lowest temperature state of working fluid 221. This can happen if the commercial process fluid 215 from commercial process fluid source 214 is at a lower temperature (State CP1, 212A) than the saturation temperature of the working fluid 221 (State 1, State 2) in immersion-cooling system 218. The fact that State 5 can have a lower temperature than State 6 is one of the factors that distinguish the inventive subject matter from a heat pump or refrigerator.

The high-pressure working fluid (State 5) flows through pressure regulator 230 and exists at a low-pressure (State 6), using thermodynamic Process D. If pressure regulator 230 is well insulated (idealized as adiabatic), then thermodynamic Process D can be idealized as isenthalpic. Depending upon the specific embodiment, pressure regulator 230 can be a passive flow restrictor, an actively-controlled flow restrictor, an off-the-shelf pressure regulator, a custom-designed pressure regulator, an expansion valve, a thermal expansion valve, a JT valve, or any other mechanism that can be used to actively or passively regulate pressure.

As will be discussed later, depending upon the temperature and pressure at State 5, and the desired pressure of low-pressure State 6, the temperature at State 6 can be higher or lower than that at State 5. For example, if State 5 is a compressed liquid with a temperature below the saturation temperature of immersion-cooling system 218, and if the liquid undergoes an ideally isenthalpic Process D, the temperature of working fluid 221 can increase, as energy is transferred from pressure energy to internal energy at nearly constant enthalpy. In this type of embodiment, the temperature of the working fluid at State 6 could be slightly higher that the temperature of the working fluid at State 5, due to viscous dissipation (which can transfer mechanical energy such as pressure energy to internal energy).

In yet another embodiment, if thermodynamic Process D is idealized as isenthalpic, but State 6 is a saturated liquid-vapor mixture, then the temperature at State 6 can be lower than the temperature at State 5.

After exiting pressure regulator 230, working fluid 221 at State 6 is directed to immersion-cooling system 218, where it is mixed with low-pressure liquid (State 1) working fluid 221 in tank 220.

Figure 2B:
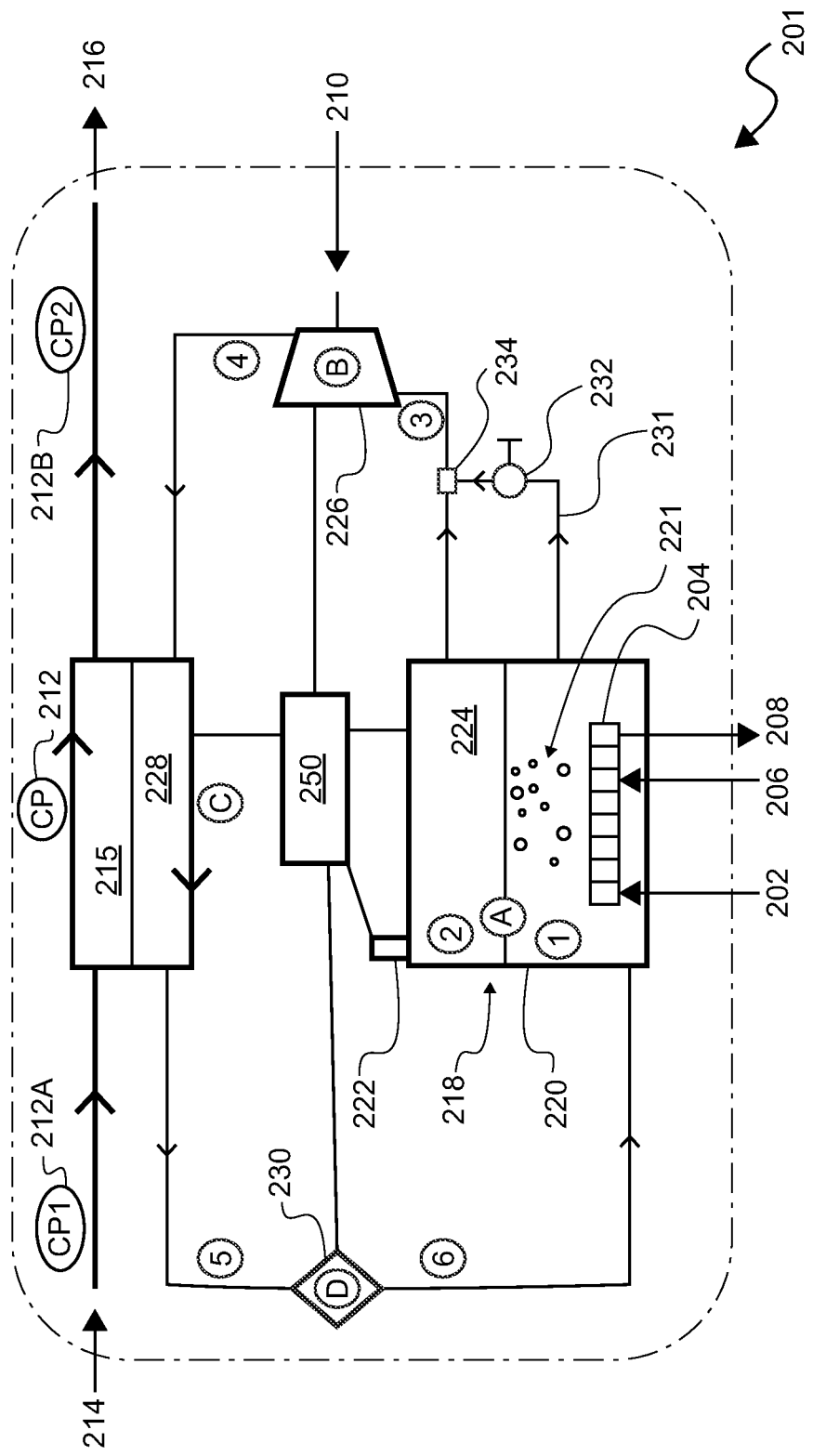

FIG. 2B shows another embodiment, where system 201 contains an optional fluid path 231 for extracting saturated low-pressure liquid-phase (State 1) working fluid 221 from immersion-cooling system 218, and directing the saturated low-pressure liquid-phase (State 1) through flow control device 232 towards junction 234. Flow control device 232 controls thermodynamic quality of the mixture of saturated low-pressure vapor (State 2) and saturated low-pressure liquid-phase (State 1), which results in State 3 that flows to compressor 226.

In some embodiments, one can adjust the quality of the saturated liquid-vapor mixture (i.e. the saturated vapor mass fraction) at State 3 by manipulation of flow control device 232. It can be desirable for State 4 to be approximately a saturated vapor (i.e. quality, $x_4$=1). By adjusting the quality of the saturated mixture at State 3 going into compressor 226, one can control the quality of the high-pressure vapor exiting compressor 226. In some embodiments, State 4 could be saturated liquid-vapor mixture ($x_4$>0.5), saturated vapor, or superheated vapor. The quality at State 3 can be adjusted to produce the desired State 4, having a desired saturated pressure and quality, or a desired pressure and temperature of superheated vapor.

Commercial process 212 can include distilling industrial chemicals, distilling petroleum chemicals, boiling water, distilling water, distilling water from petroleum chemicals, distilling ethyl alcohol or other alcohols, desalination of water, and other commercial processes.

As an illustrative embodiment, commercial process 212 could comprise boiling water at atmospheric pressure. Water has a well-known saturation temperature of $T_{sat}$=100° C. at a pressure of $P_{sat}$=1 atm. Therefore, nucleic boiling could occur when the boiling surface temperature is in excess of the saturation temperature, and could be approximately 105-115° C., depending upon the desired heat flux (see *Fundamentals of Heat and Mass Transfer*, Incropera & DeWitt, Wiley, $5^{th}$ Ed., incorporated herein for reference). The specific heat of water is approximately $C_p$=4.186 kJ $kg^{-1}$ $K^{-1}$. The latent heat of vaporization is the energy required to cause a phase change from liquid to vapor at a specific saturation temperature. The latent heat of water is approximately $h_{fg}$=2257 kJ $kg^{-1}$. Therefore, if a mass of m=1 kg water enters system 200, 201 from commercial process fluid source 214 at a temperature $T_{in}$=20° C., it will take Q=1 kg×4.186 kJ $kg^{-1}$ $K^{-1}$×80 K=334 kJ of energy to heat the liquid water to $T_{sat}$=100° C. However, to produce a phase change from saturated liquid to saturated vapor, it would take an additional 2257 kJ of energy, which is nearly 6.7 times as much energy as sensible heating from 20° C. to 100° C., bringing the total energy required to $Q_{tot}$=2591 kJ=334 kJ+2257 kJ. Furthermore, if the phase change occurs as a result of heat transfer, through heat exchanger 228, the thermal energy source would need to be at a temperature in excess of $T_{sat}$=100° C.

A prior art cooling system, such as immersion-cooling system 100 might not be able to efficiently drive a commercial process, because the temperature of the vapor-phase working fluid exiting the tank is too low. For example, in a typical system such as that shown in FIG. 1, the saturated vapor-phase working fluid 114 would exit headspace 120 at a temperature of perhaps 40° C.-80° C. (depending upon the saturation temperature of working fluid). Using Novec 7200 (or similar fluid) as the working fluid with a saturation temperature of 76° C., the working fluid vapor could only be used to heat a commercial process fluid to a maximum of 76° C. If the commercial process fluid is water, and the commercial process requires boiling m=1 kg of water, then the working fluid could supply at most Q=m×Cp×ΔT=1 kg×4.186 kJ $kg^{-1}$ $K^{-1}$×(76−20) K=234 kJ. This is approximately 9% (=234/2591) of the total 2591 kJ of energy required to boil water at atmospheric pressure with an initial temperature of 20° C. This low efficiency of 9% may not be desirable for subsidizing the energy of a commercial process, and further illustrates the longstanding problem that the computing industry, and Bitcoin mining industry in particular, has been unable to solve.

In contrast, in embodiments of the inventive subject matter, the pressure at State 4 and State 5 can be sufficiently high that the saturation temperature of the working fluid exceeds the maximum desired temperature of the commercial process fluid 215, and no additional energy source would be required.

In an illustrative example of commercial process 212 being directed towards boiling water starting at 20° C. and 1 atm of pressure, one could choose Novec 7200 (or similar type of fluid) as the working fluid. The low-pressure vapor-phase at State 3 could have a saturation pressure of $P_3=1$ atm, and a saturation temperature of $T_3=76°$ C. Compressor 226 could compress the fluid to approximately to a temperature of say $T_4=112°$ C. (selecting an excess boiling temperature of 12° C.). The saturation pressure of Novec 7200 can be estimated using Antoine's equation, where $\ln(P_{sat})=22.289-3752.1/T_{sat}$, where the unit of pressure is Pa and the unit of temperature is K. The pressure for State 4 and State 5 can be estimated to be approximately $P_4=P_5=2.80$ atm (corresponding to a saturation temperature of $T_{sat,4}=112°$ C.).

If we assume that water enters the commercial process 212 at an initial temperature of 20° C., we could realistically assume that the water could completely condense the working fluid, and also sensibly cool the high-pressure liquid-phase working fluid 221 to a compressed liquid with a temperature of 32° C. (State 5). (Note: the water could potentially cool the working fluid to an even lower temperature, but we will use 32° C. as a reasonable value for this illustrative example). Assuming an isentropic compression process B, we roughly estimate that it could take approximately We=3 kJ mol$^{-1}$ of electrical work to compress the working fluid from State 3 ($T_3=76°$ C., $P_3=1$ atm) to State 4 ($T_4=112°$ C., $P_4=2.8$ atm), producing a quality of approximately $x_4=0.78$ (calculation not shown). We further roughly estimate that about Q=47 kJ mol$^{-1}$ of thermal energy of working fluid 221 could be transferred through heat exchanger 228 to commercial process 212 directed towards heating and boiling water.

Focusing on commercial process 212, the water can be completely boiled by repurposing the resulting thermal energy from computer system 204, adding approximately 3 kJ of electrical work to compressor 226. Thermodynamic system 200, 201 could release approximately 47 kJ of thermal energy, with much of that thermal energy being transferred at an approximate saturation temperature of $T_4=112°$ C. to boil the water. (calculation not shown). The coefficient of performance of system 200, 201 could be approximately COP=15.6=47/3=Desired Output/Required Input. (Note: the required electrical work energy supplied to compressor 226 and thermal energy released to heat/boil water are approximate and presented here for illustrative purposes only. The actual implementation of compressor 226 can vary significantly, depending upon the efficiency of the specific type of compressor, or if multistage compressors are used, or if heat is transferred to the surrounding environment, etc. Furthermore, the amount of thermal energy extracted working fluid 221 in heat exchanger 228 could vary significantly, and the amount is approximate).

For this illustrative embodiment, system 200, 201 could potentially provide an approximately 93% (0.93=1−1/15.6) reduction in energy that would otherwise be required to boil water. This approximately 93% reduction in energy that would otherwise be required to operate commercial process 212 could solve a longstanding problem in the high-performance computing industry and Bitcoin mining industry, where it is desirable to efficiently repurpose the resulting thermal energy for a commercial process to help offset the energy costs associated with large-scale computations.

In some embodiments, the working fluid can have a saturation temperature at atmospheric pressure in immersion-cooling system 218 of 40° C. to 85° C., inclusive.

In some embodiments, compressor 226 can compress the working fluid from a low-pressure State 3 to high-pressure State 4, thereby increasing the temperature between State 3 and State 4 by 75° C.-100° C., inclusive.

In some embodiments, compressor 226 can compress the working fluid from a low-pressure State 3 to high-pressure State 4, thereby increasing the temperature between State 3 and State 4 by 25° C.-75° C., inclusive.

In some embodiments, compressor 226 can compress the working fluid from a low-pressure State 3 to high-pressure State 4, thereby increasing the temperature between State 3 and State 4 by 35° C.-55° C., inclusive.

In some embodiments, compressor 226 can compress the working fluid from a low-pressure State 3 to high-pressure State 4, thereby increasing the temperature between State 3 and State 4 by 1° C.-25° C., inclusive.

In some embodiments, compressor 226 can compress the working fluid from a low-pressure State 3 to high-pressure State 4, wherein the temperature of State 4 is 80° C.-110° C., inclusive.

In some embodiments, compressor 226 can compress the working fluid from a low-pressure State 3 to high-pressure State 4, wherein the temperature of State 4 is 110° C.-125° C., inclusive.

In some embodiments, compressor 226 can compress the working fluid from a low-pressure State 3 to high-pressure State 4, wherein the temperature of State 4 is 125° C.-160° C., inclusive.

In some embodiments, controller 250 can be used to monitor and control at least two of the computer system 204, tank 220, operation of bellows 222, compressor 226, pressure regulator 230, and commercial process 212. In some embodiments, controller 250 can use feedback control and/or feedforward control.

For example, when the bellows 222 expand beyond a preset amount, controller 250 can adjust pressure regulator 230 and/or compressor 226 to reduce a pressure of the low-pressure liquid phase (State 6) of the working fluid 221 returning to the tank 220.

In another example, when commercial process 212 requires a higher temperature of the high-pressure vapor-phase (State 4), controller 250 can adjust operation of the pressure regulator 230 and/or compressor 226 to adjust State 4.

In another example, controller 250 can control a mass flow rate of the commercial process 212 as a function of the thermal energy produced by the computer system 204.

In yet another example, controller 250 can control the rate of electrical energy usage by the computer system 204 as a function of electrical energy cost and/or computational incentives.

FIGS. 3A, 3B, 3C, and 3D are exemplary thermodynamic process (pressure-enthalpy) diagrams for when the compression process produces a saturated liquid-vapor mixture that can be achieved with system 200.

Figure 3A:
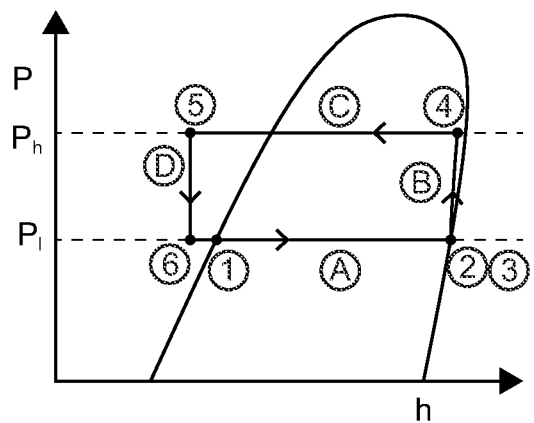
FIGS. 3A, 3B, 3C, and 3D are exemplary thermodynamic process (pressure-enthalpy) diagrams for when the compression process produces a saturated liquid-vapor mixture.
Figure 3B:
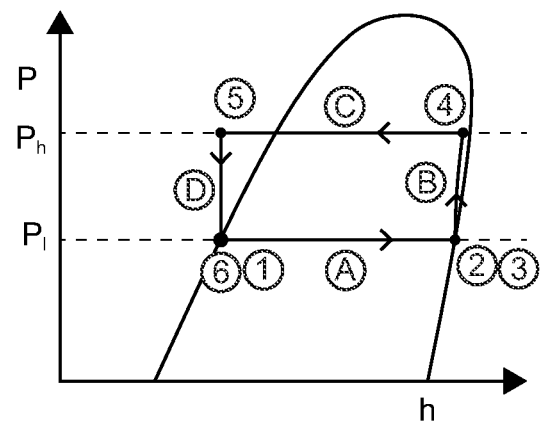
Figure 3C:
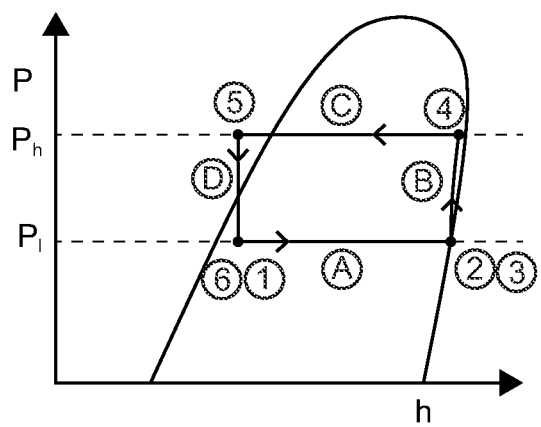
Figure 3D:
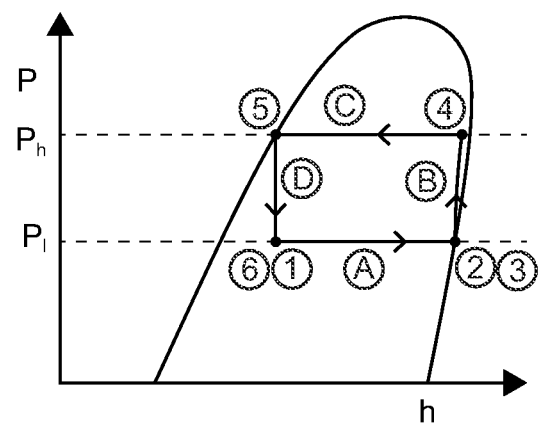

In FIGS. 3A and 3B, State 5 can be at a lower temperature than State 6.

FIGS. 4A, 4B, 4C, and 4D are exemplary thermodynamic process (pressure-enthalpy) diagrams for when the compression process produces superheated vapor that can be achieved with system 200.

Figure 4A:
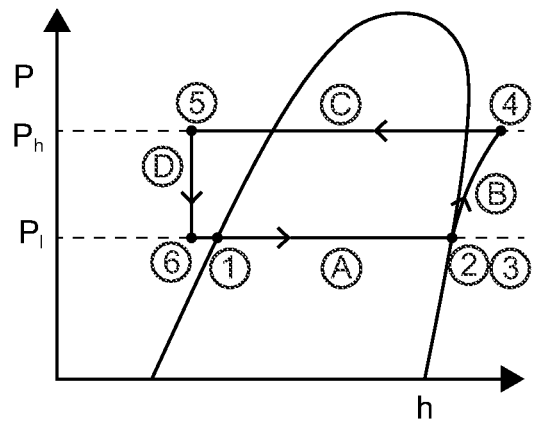
FIGS. 4A, 4B, 4C, and 4D are exemplary thermodynamic process (pressure-enthalpy) diagrams for when the compression process produces superheated vapor.
Figure 4B:
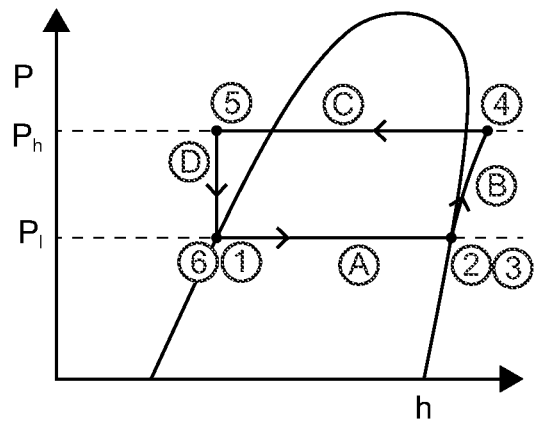
Figure 4C:
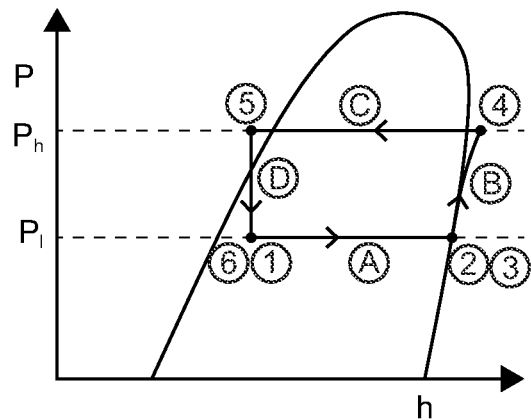
Figure 4D:
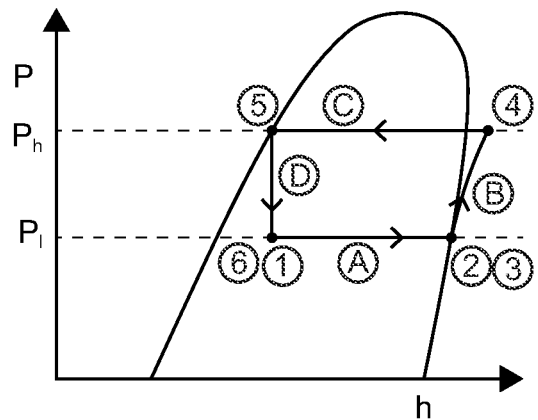

In FIGS. 4A and 4B, State 5 can be at a lower temperature than State 6.

FIGS. 5A, 5B, 5C, and 5D are exemplary thermodynamic process (pressure-enthalpy) diagrams for when the compression process produces saturated vapor that can be achieved with system 201. In these diagrams, saturated low-pressure vapor (State 2) is mixed with saturated low-pressure liquid (State 1) to obtain saturated liquid-vapor mixture (State 3), before it is compressed (Process B).

Figure 5A:
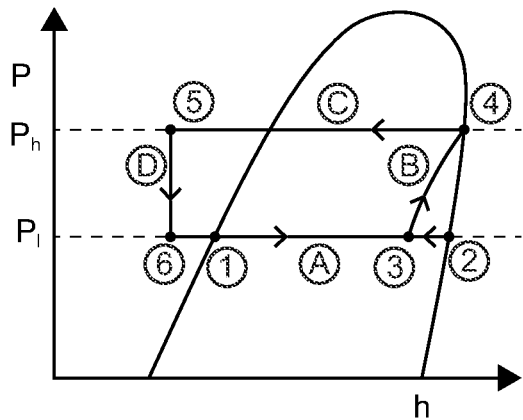
FIGS. 5A, 5B, 5C, and 5D are exemplary thermodynamic process (pressure-enthalpy) diagrams for when the compression process produces saturated vapor.
Figure 5B:
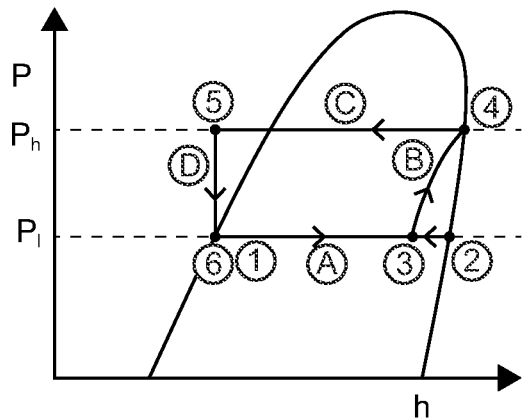
Figure 5C:
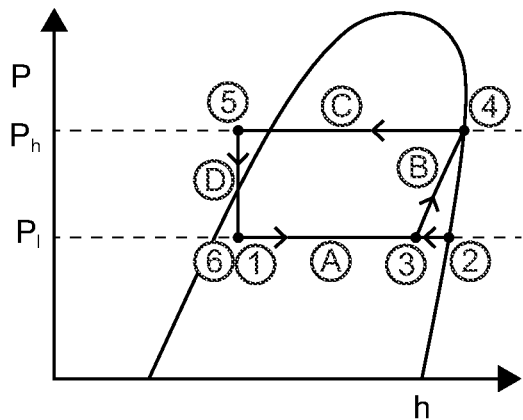
Figure 5D:
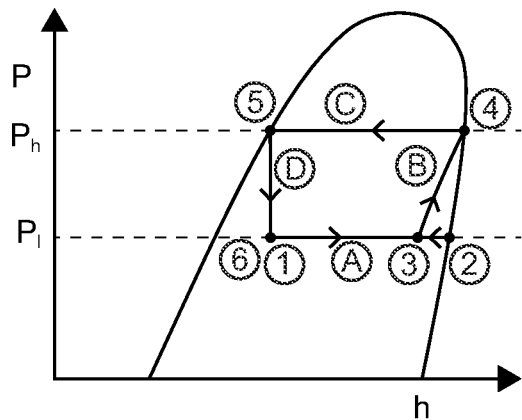

In FIGS. 5A and 5B, State 5 can be at a lower temperature than State 6.

FIGS. 6A, 6B, 6C, 6D, and 6E are exemplary thermodynamic process (pressure-enthalpy) diagrams for commercial processes 212 (substantially isobaric) that could be driven by the inventive subject matter.

FIGS. 6A and 6B show a phase change of the commercial process fluid between States CP1 and CP2.

FIG. 6C shows a partial phase change of the commercial process fluid between States CP1 and CP2.

FIGS. 6D and 6E show sensible heating of the commercial process fluid between States CP1 and CP2.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps can be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

The invention claimed is:

1. A method of subsidizing a cost of providing information, comprising:
    providing an immersion-cooling system having a tank containing a computer system immersed in a low-pressure liquid-phase of a working fluid, the tank having a headspace containing a low-pressure vapor-phase of the working fluid, and the computer system providing the information;
    directing the low-pressure vapor-phase of the working fluid from the headspace to a compressor external to the tank;
    compressing the low-pressure vapor-phase of the working fluid to produce a high-pressure vapor-phase of the working fluid at a temperature elevated above a temperature of the working fluid in the tank;
    utilizing the high-pressure vapor-phase of the working fluid in a heat exchanger to operate a commercial process, during which the high-pressure vapor-phase of the working fluid is condensed to a high-pressure liquid-phase of the working fluid;
    reducing a pressure of the high-pressure liquid-phase to produce a low-pressure liquid-phase of the working fluid;
    returning the low-pressure liquid-phase of the working fluid to the tank, where it is mixed with the low-pressure liquid-phase of the working fluid in the tank; and
    monitoring and controlling among at least two of the computer system, the tank, operation of a bellows, the compressor, a pressure regulator, and the commercial process;
    wherein the commercial process involves application or transfer of thermal energy to a solid or fluid for use in production of a product or service.

2. The method of claim 1, wherein the working fluid comprises a mixture of at least two different working fluids having at least two different saturation temperatures within the tank.

3. The method of claim 1, wherein the working fluid has a saturation temperature in the immersion-cooling system of 40° C. to 85° C., inclusive.

4. The method of claim 1, wherein the step of compressing the low-pressure vapor-phase of the working fluid comprises raising the temperature of the low-pressure vapor-phase of the working fluid by 25° C.-75° C., inclusive.

5. The method of claim 1, wherein the step of compressing the low-pressure vapor-phase of the working fluid comprises raising the temperature of the low-pressure vapor-phase of the working fluid by 35° C.-55° C., inclusive.

6. The method of claim 1, wherein the step of compressing the low-pressure vapor-phase of the working fluid comprises raising the temperature of the low-pressure vapor-phase of the working fluid by 1° C.-25° C., inclusive.

7. The method of claim 1, wherein the step of compressing the low-pressure vapor-phase of the working fluid such that a temperature of the high-pressure vapor-phase of the working fluid reaches 110° C.-125° C., inclusive.

8. The method of claim 1, wherein the commercial process comprises heating water.

9. The method of claim 1, wherein the commercial process comprises distilling ethanol.

10. The method of claim 1, wherein a phase change from the low-pressure liquid-phase of the working fluid to the low-pressure vapor-phase of the working fluid is substantially isobaric.

11. The method of claim 1, wherein compressing from the low-pressure vapor-phase of the working fluid to the high-pressure vapor-phase of the working fluid is substantially isentropic.

12. The method of claim 1, wherein a phase change from the high-pressure vapor-phase of the working fluid to the high-pressure liquid-phase of the working fluid is substantially isobaric.

13. The method of claim 1, wherein the pressure reduction from the high-pressure liquid-phase of the working fluid to the low-pressure liquid-phase of the working fluid is substantially isenthalpic.

14. The method of claim 1, wherein the information comprises a Bitcoin hash.

15. The method of claim 1, further comprising a flow control device configured to deliver a controlled saturated liquid-vapor mixture to the compressor.

16. The method of claim 1, further comprising monitoring and control among at least three of the computer system, the tank, operation of the bellows, the compressor, the pressure regulator, and the commercial process.

17. The method of claim 1, further comprising using feedback to control a rate of electrical energy usage by the computer system as a function of electrical energy cost and/or computational incentives.

18. A system that uses thermal energy resulting from an information processing system to drive a commercial process, comprising:
- a computer system configured to generate information;
- an immersion-cooling system configured with a tank that contains the computer system, a low-pressure liquid-phase of a working fluid and a headspace containing a low-pressure vapor-phase of the working fluid, and a bellows;
- a compressor disposed outside of the tank, and configured to extract the low-pressure vapor-phase of the working fluid from the tank;
- wherein the compressor is further configured to compress the low-pressure vapor-phase of the working fluid to produce a high-pressure vapor-phase of the working fluid of the working fluid at an elevated temperature;
- a heat exchanger configured to transfer thermal energy from the high-pressure vapor-phase of the working fluid to the commercial process, during which the high-pressure vapor-phase of the working fluid is condensed to a high-pressure liquid-phase of the working fluid;
- a pressure regulator configured to reduce the pressure of the high-pressure liquid-phase of the working fluid to the low-pressure liquid-phase of the working fluid, which is returned to the tank, wherein it is mixed with a low-pressure liquid-phase of the working fluid; and
- a controller configured to monitor and control among at least two of the computer system, the tank, operation of the bellows, the compressor, the pressure regulator, and the commercial process;
- wherein the commercial process involves application or transfer of thermal energy to a solid or fluid for use in production of a product or service.

19. The system of claim 18, wherein the computer system comprises a processor configured to mine Bitcoins.

20. The system of claim 19, wherein the tank is sized and dimensioned to contain at least 6 Bitcoin miners.

21. The system of claim 18, wherein the commercial process comprises boiling water.

22. The system of claim 18, wherein the commercial process comprises distilling an alcohol.

23. The system of claim 18, wherein the tank is configured for substantially isobaric phase change of the working fluid from the low-pressure liquid-phase of the working fluid to the low-pressure vapor-phase of the working fluid.

24. The system of claim 18, wherein the compressor is configured for substantially isentropic compression of the working fluid, from the low-pressure vapor-phase of the working fluid to the high-pressure vapor-phase.

25. The system of claim 18, wherein the heat exchanger is configured for substantially isobaric condensation of the working fluid, wherein thermal energy is transferred from the working fluid to the commercial process, resulting in at least a partial phase change of the working fluid from high-pressure vapor-phase of the working fluid to high-pressure liquid-phase of the working fluid.

26. The system of claim 18, wherein the pressure regulator is configured for substantially isenthalpic pressure reduction of the working fluid from the high-pressure liquid-phase to the low-pressure liquid-phase.

27. A system that uses thermal energy resulting from an information processing system to drive a commercial process, comprising:
- a computer system configured to generate information;
- an immersion-cooling system configured with a tank that contains the computer system, a low-pressure liquid-phase of a working fluid and a headspace containing a low-pressure vapor-phase of the working fluid, and bellows;
- a compressor disposed outside of the tank, and configured to extract the low-pressure vapor-phase of the working fluid from the tank;
- wherein the compressor is further configured to compress the low-pressure vapor-phase of the working fluid to produce a high-pressure vapor-phase of the working fluid at an elevated temperature;
- a heat exchanger configured to transfer thermal energy from the high-pressure vapor-phase of the working fluid to the commercial process, during which the high-pressure vapor-phase of the working fluid is condensed to a high-pressure liquid-phase of the working fluid; and
- a pressure regulator configured to reduce the pressure of the high-pressure liquid-phase of the working fluid to the low-pressure liquid-phase of the working fluid, which is returned to the tank, wherein it is mixed with a low-pressure liquid-phase of the working fluid;
- wherein the commercial process involves application or transfer of thermal energy to a solid or fluid for use in production of a product or service.

* * * * *